United States Patent [19]

Griffith

[11] Patent Number: 4,890,270

[45] Date of Patent: Dec. 26, 1989

[54] METHOD AND APPARATUS FOR MEASURING THE SPEED OF AN INTEGRATED CIRCUIT DEVICE

[75] Inventor: Scott J. Griffith, Waltham, Mass.

[73] Assignee: Sun Microsystems, Mountain View, Calif.

[21] Appl. No.: 179,413

[22] Filed: Apr. 8, 1988

[51] Int. Cl.[4] .......................... G04F 8/00; G01R 15/12
[52] U.S. Cl. .............................. 368/113; 324/73 AT; 377/20
[58] Field of Search ............... 368/113–120; 324/73 R, 73 AT, 73 PC, 78 R; 377/19, 20; 371/21; 364/569

[56] References Cited

U.S. PATENT DOCUMENTS

| 3,422,422 | 1/1969 | Frank et al. ............... | 324/78 R |
| 3,859,512 | 1/1975 | Ritzinger ................... | 364/569 |
| 4,164,648 | 8/1979 | Chu ........................... | 368/118 |
| 4,245,337 | 1/1981 | Daniels et al. ............ | 368/82 |
| 4,290,130 | 9/1981 | Loudenscager ........... | 368/47 R |
| 4,456,386 | 6/1984 | Dellea ...................... | 368/201 |
| 4,461,582 | 7/1984 | Walther ................... | 368/201 |
| 4,495,628 | 1/1985 | Zasio ....................... | 324/73 AT |
| 4,708,491 | 11/1987 | Luitje ...................... | 368/200 |
| 4,771,251 | 9/1988 | Allen et al. ............... | 331/57 |

FOREIGN PATENT DOCUMENTS 0136207 5/1989 European Pat. Off. .
2141829 1/1985 United Kingdom .

Primary Examiner—Vit W. Miska
Attorney, Agent, or Firm—Blakely Sokoloff Taylor & Zafman

[57] ABSTRACT

A circuit for detecting manufacturing deficiencies in semi-conductor devices and selecting marketable chips comprises a speed circuit to determine the speed at which a particular chip operates. The speed circuit is a small, self-contained circuit that may be placed on any type of semi-conductor chip. It includes an oscillator, a counter, and a control logic circuit. The speed circuit is coupled to an external clock and a control processor. The external clock provides a benchmark against which the operation of the chip can be compared. The control processor uses the output of the speed circuit to compute the speed at which the semi-conductor device operates.

17 Claims, 2 Drawing Sheets

METHOD AND APPARATUS FOR MEASURING THE SPEED OF AN INTEGRATED CIRCUIT DEVICE

BACKGROUND OF THE INVENTION

1. Field of the Invention:

This invention relates to the field of integrated circuits and more particularly, to the calibration and testing of integrated circuits.

2. Art Background:

Most integrated circuits are manufactured on silicon wafers, with a large number of the circuits fabricated on each wafer. Each integrated circuit is comprised of a plurality of semi-conductor devices, and is referred to as a "chip". Unfortunately, the manufacture of semi-conductor devices is not an exact science. In order for a particular integrated circuit chip to be marketable, it must perform within certain technical specifications. One of the most important performance criteria is the speed at which the chip operates. The "speed" of an integrated circuit may generally be defined as the maximum clock rate at which the integrated circuit will function properly. It is not uncommon in the semiconductor industry to have successful manufacturing yields of only 6–9% for all the chips fabricated on a wafer. Therefore, each chip must be tested prior to being sold.

Previously, quality control procedures for integrated circuits required that each chip be rigorously tested to determine if it was able to perform the functions for which it was designed. This is often a complex procedure that entails the used of special testing devices. Each chip has a unique design, therefore, the test equipment must be reconfigured each time a new circuit is tested.

It is desirable to provide a circuit design within a semi-conductor chip which permits a quick determination of the speed of the chip to assist in testing manufactured parts prior to installation in systems. The speed of different integrated circuits often vary from chip to chip on a given wafer. The speed of an integrated circuit may also vary with environmental parameters, such as power supply voltage, temperature, etc. However, it has been found that the speed at which integrated circuits operate does not vary appreciably over the surface of the chip. It is therefore possible to provide each chip with a small, self-contained circuit. This circuit, referred to in this Specification as a "speed circuit", can be used to calculate the speed at which the chip operates.

The speed circuit of the present invention reduces the cost of testing chips by obviating the need for special test equipment, and identifying chips that clearly do not meet the required standards for speed. Instead of configuring new test equipment each time a different type of chip is tested, standardized equipment can be used to test the chip by use of the speed circuit. Once acceptable chips are found, they can be further tested using other methods, if necessary. However, since most of the unmarketable chips will have been identified, the cost of testing will be greatly reduced.

SUMMARY OF THE INVENTION

A circuit is disclosed for detecting manufacturing deficiencies in semi-conductor devices and selecting marketable chips. The present invention comprises a speed circuit to determine the speed at which a particular chip operates. The speed circuit is a small, self-contained circuit that may be placed on any type of semi-conductor chip. It includes an oscillator, a counter, and a control logic circuit. The speed circuit is coupled to an external clock and a control processor. The external clock provides a benchmark against which the operation of the chip can be compared. The control processor uses the output of the speed circuit to compute the speed at which the semi-conductor device operates.

DETAILED DESCRIPTION OF THE DRAWINGS

A speed circuit for measuring the operational speed of integrated circuit chips is disclosed. In the following description, numerous details are set forth for the purpose of explanation. These include specific components and arrangements in order to provide a thorough understanding of the present invention. However, it will be apparent to one skilled in the art that the present invention may be practiced without these specific details. In other instances, well known components such as an external processor, counters, clock circuits, etc. have not been described in detail in order to not obscure the present invention unnecessarily. In the following discussion, the same numbers are used to designate the elements throughout the drawings.

Figure 1:
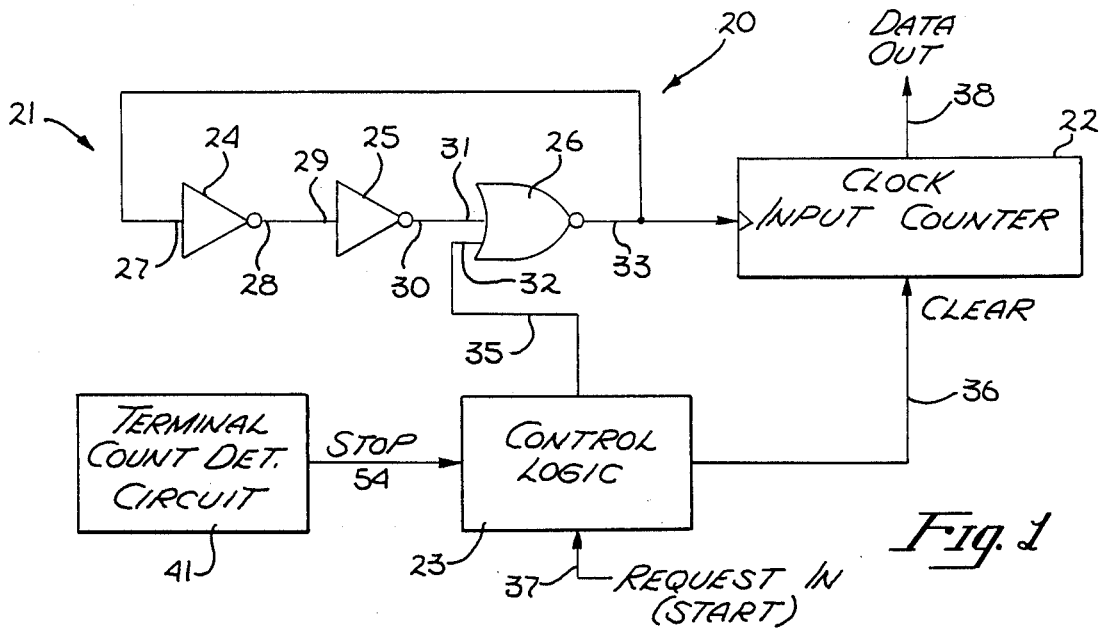
FIG. 1 illustrates the preferred embodiment of the speed circuit of the present invention.
Figure 4:
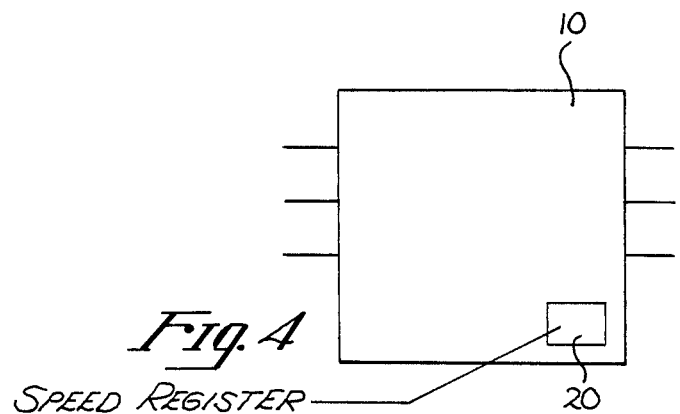
FIG. 4 symbolically illustrates the speed circuit disposed on a typical semi-conductor device.

Referring to FIG. 1, the preferred embodiment of the present invention is illustrated. The speed circuit 20 comprises a ring oscillator 21, a counter 22, and a control logic circuit 23. In the preferred embodiment, the oscillator 21, counter 22 and control logic circuit 23 are located adjacent to each other on the surface of the semi-conductor chip 10 (see FIG. 4). This arrangement allows the speed circuit 20 to occupy a minimum of the surface area of chip 10. This is an important feature, because the surface of a chip 10 is often crowded with many different circuits. However, it will be appreciated that the elements of the present invention can be distributed over other areas of chip 10, if the design of a particular chip necessitates such an architecture.

The ring oscillator 21 includes two invertors 24, 25 and a two input NOR gate 26. The invertors are coupled back to back. The output 30 of the invertor pair is coupled to one input 31 of the NOR gate 26. As illustrated, the other input 32 of the NOR gate 26 is coupled to the control logic circuit 23. As will be discussed more fully below, when the speed circuit is in a standby mode, the control logic circuit 23 generates a count enable signal and holds such signal high on line 35. This places the oscillator 21 in a stable configuration and forces the output 33 of the NOR gate 26 to remain low.

In the preferred embodiment, the output 33 of the NOR gate 26 is used as the output of the oscillator.

It will be appreciated by those skilled in the art that many other designs may be used for the oscillator. For example, any odd number of invertors coupled in series forms an equally unstable configuration. Also, the NOR gate of the preferred embodiment may be replaced with a NAND gate to achieve the same result.

Referring again to FIG. 1, the output 33 of the oscillator 21 is coupled to the clock input of a counter 22. The counter can be made from any design that is well known in the art. The counter is used to count the oscillations of the oscillator 21. Therefore, the counter 22 must be able to store a value, and output the value upon a signal from an external source. Also, the value that is stored in the counter must be able to be reset to zero when the oscillator 21 is activated. The counter 22 can be of the rising edge or falling edge type. That is, the value that is stored in the counter may increase when the oscillator changes from 0 to 1 or from 1 to 0.

The operation of the oscillator 21 and the counter 22 are controlled by the control logic circuit 23. The control logic circuit performs three functions: changing the oscillator 21 between standby and operational modes through the use of the count enable signal 35, resetting the value of the counter 22 to zero, and monitoring terminal count detector circuit 41. The exact design of the control logic circuit 23 will depend on several factors, including the structure of the chip 10 and the design of the counter 22. However, the design of such circuit will be apparent to one skilled in the art.

The control logic circuit 23 controls the oscillator 21 through the use of the count enable signal 35. Normally, this signal is kept high in the preferred embodiment. This forces the output of the oscillator 33 to remain low. When the control logic circuit 23 changes the count enable signal 35 to a value of 0 (low), the oscillator 21 is placed in an operational mode. The counter 22 is controlled by a data clear line 36 coupled between the control logic 23 and the counter. In the preferred embodiment, the counter 22 is cleared when the control logic circuit sends a signal over the data clear line 36. It will be apparent to those skilled in the art that counters having different designs may be reset to zero with different signals from the control logic circuit. The manner in which the control logic circuit monitors an external clock will be described more fully below.

Figure 2:
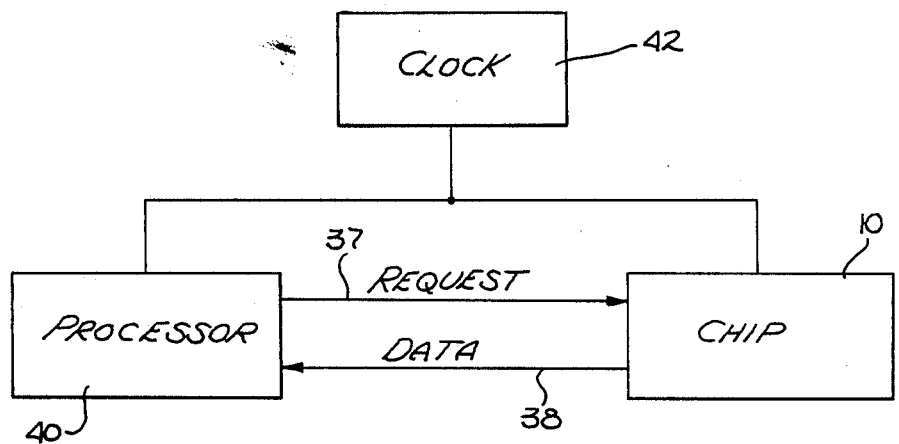
FIG. 2 is a diagrammatical illustration of the speed circuit coupled to an external clock and control processor.

Referring to FIG. 2, the operation of the speed circuit 20 is activated by a control processor 40. The processor can be one of a variety of commercially available microcomputers. In addition, the processor 40 may be formed on the surface of chip 10, or may be an external processor coupled remotely to the chip 10 and speed circuit 20. As illustrated, the processor 40 is coupled to the chip 10 containing the speed circuit 20 by a request line 37 and a data line 38. As will be described, an external clock 42 is coupled to both the processor 40 and the terminal count detector circuit 41. The external clock 42 serves as a timing benchmark to measure the speed at which the speed circuit operates.

The speed circuit 20 is enabled when the external processor 40 sends a read signal to the control logic circuit 23 over the request line 37. At that point the count enable signal 35 is asserted low by the control logic circuit 23. This places the ring oscillator 21 in an operational mode and causes the output of the NOR gate 33 to oscillate between 0 and 1. Each oscillation of the circuit increases the value stored in the counter 22 by 1.

Figure 3:
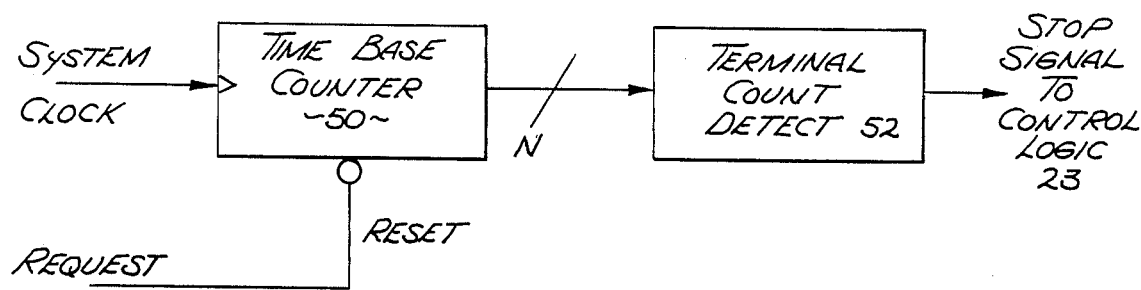
FIG. 3 is a block diagram illustrating a control circuit for counting a predetermined number of system clock cycles to define a base time interval.

Referring now to FIG. 3, the terminal count detector circuit 41 includes a time base counter 50 coupled to a terminal count detector 52, as illustrated. System clock 42 is coupled to the clock input of the time base counter 50, and request line 37 is coupled to the reset input of the counter 50. The transmission of a read signal over request line 37 by the processor 40, acts to simultaneously reset the time base counter 50 to zero and place the ring oscillator in an operational mode, as described above. Time base counter 50, driven to increment itself with each system clock pulse, outputs A count value (N bits) to the terminal count detector 52. The terminal count detector 52 compares the output of the time base counter 50 to a predetermined value, which, once it is reached, results in the generation of a "stop" signal 54. The time elapsed for the time base counter 50 to count up to the terminal count is defined as the "time base interval". Stop signal 54 is provided to control logic 23 and disables the oscillator 21 by returning the count enable signal to a high value. This stops the oscillation of the ring oscillator 21 and the counter 22 ceases counting. The value of the counter 22 is then driven onto the data line 38 for use by the processor 40.

Figure 5:
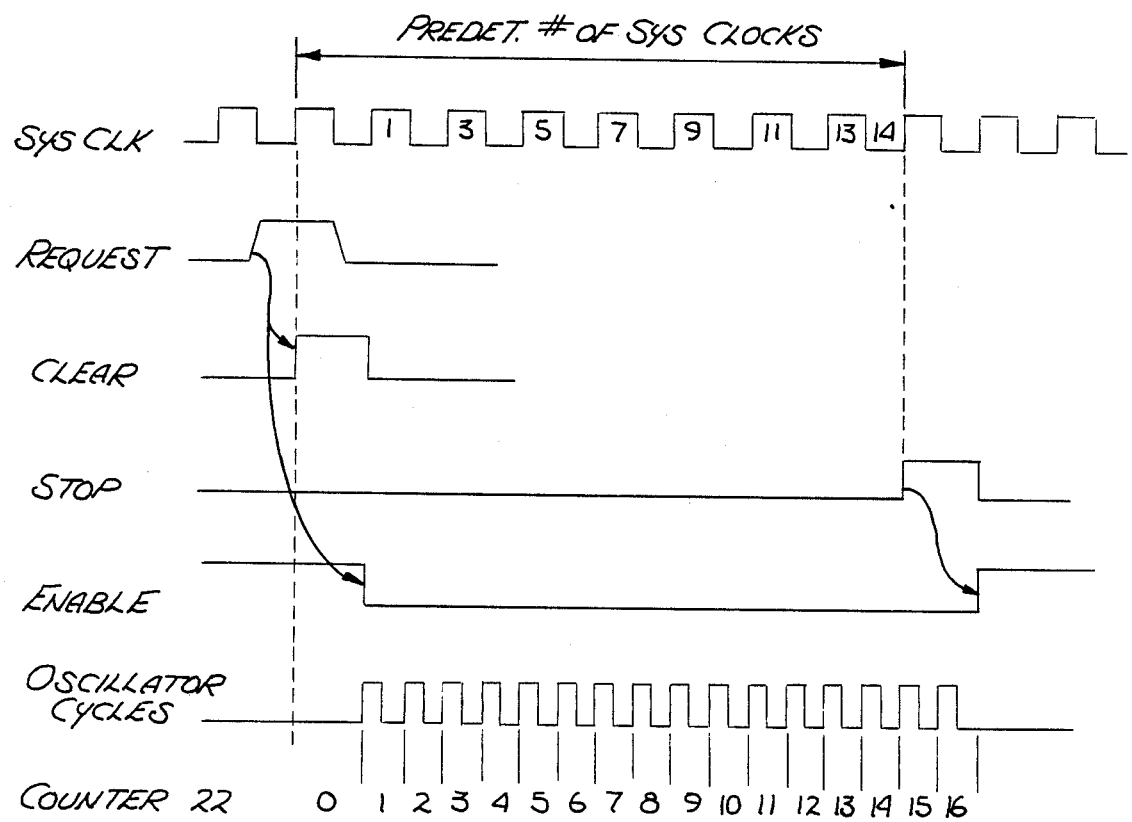
FIG. 5 is a timing diagram illustrating the relationship between the system clock, the request, clear and enable signals, and the number of counts in the speed circuit counter.

The external processor 40 calculates the speed of the particular chip 10 that is being tested by determining the number of counts of the speed circuit during the time base interval. A timing diagram illustrating the request, clear, stop, enable and counter counts, in relation to the system clock pulses is shown in FIG. 5. In the preferred embodiment, the components comprising the ring oscillator 21 are chosen such that there are a plurality of counts during each time base interval.

Accordingly, a speed circuit for integrated circuit chips has been disclosed. The invention allows the speed of a chip to be easily tested in a manner not previously available in the art. Although specific details have been described herein, it will be understood that various changes can be made in the components and arrangements of the present invention without departing from its intended scope. These variations will be apparent to those skilled in the art.

I claim:

1. A device for measuring the speed of an integrated circuit chip, said chip having located thereon a plurality of electronic circuits, said device comprising:
    oscillator means disposed on said chip for producing an oscillating output signal on an output line of said oscillator means;
    counter means coupled to said oscillator means for counting the number of oscillations of said oscillator, said counter means producing a counter output signal having a value;
    control logic means coupled to said oscillator means and said counter means for selectively enabling said oscillator means and, after a predetermined period of time, disabling said oscillator means.

2. The device of claim 1, further comprising an external clock for generating clock signals at a known rate, said external clock being coupled to a terminal count detector circuit means for measuring said predetermined period of time as a predetermined number of said clock signals, said terminal count detector circuit means in turn being coupled to said control logic means.

3. The device of claim 1, wherein when said control logic means enables said oscillator means, said control logic means also transmits a signal to said counter means to reset said counter value to zero.

4. The device as described in claim 1, wherein said oscillator means is substantially surrounded by the electronic circuits.

5. A speed circuit for measuring the speed at which an integrated circuit chip having located thereon a plurality of electronic circuits operates, said speed circuit comprising:
an oscillator disposed on said chip, said oscillator generating an output signal, wherein said oscillator comprises a plurality of inverters and a NOR gate, coupled together to form a ring oscillator, said oscillator being adapted to operate in a standby mode and an operational mode, such that in said standby mode said output signal of said oscillator is fixed at a first level and in said operational mode said output signal of said oscillator continuously varies between said first and a second level;
a counter coupled to an output line of said oscillator, for counting a number of oscillations of said output signal when said oscillator is in said operational mode;
control logic means coupled to said oscillator and said counter, said control logic means selectively issuing an enable signal to said oscillator so as to place said oscillator in said operational mode and, after a predetermined amount of time, selectively issuing a disable signal to said oscillator so as to place said oscillator in said standby mode;
processor means coupled to an output of said counter for reading said number of said oscillations counted by said counter after said control logic means issues said disable signal.

6. The device as described in claim 5, wherein said oscillator comprises first and second invertors, each of said invertors having an input and an output, said NOR gate having two inputs and an output, said output of said first invertor being coupled to said input of said second invertor, said output of said second invertor being coupled to said first input of said NOR gate, said output of said NOR gate being coupled to said input of said first invertor.

7. The device as described in claim 6, wherein said control logic means is coupled to said second input of said NOR gate and said output of said oscillator is coupled to an input of said counter.

8. The device of claim 7, wherein said oscillator, said counter, and said control logic means are located adjacent to each other on said chip.

9. The device as described in claim 7, wherein the value stored in said counter increases when said oscillator changes between said first and second levels.

10. The device as described by claim 4, further including clock means for generating clock signals at a predetermined frequency, said clock means being coupled to said control processor means.

11. The device as described in claim 10, further including terminal count detector means coupled to said control logic means and said clock means, said detector means counting a predetermined number of said clock signals defining said predetermined amount of time, and said detector means generating a stop signal after said predetermined number of clock signals are counted.

12. The device as described in claim 11, wherein said stop signal is transmitted from said detector means to said control logic means, said control logic means then placing said oscillator in said standby mode by issuing said enable signal.

13. The device as described in claim 7, wherein said enable signal comprises transmitting a binary value of 0 from said control logic means to said second input of said NOR gate.

14. The device as described in claim 7, wherein said disable signal comprises transmitting a binary value of 1 from said control logic means to said second input of said NOR gate.

15. The device as described in claim 3, wherein said plurality of inverters and said NOR gate are substantially surrounded by the electronic circuitry.

16. A method for determining the operational speed of an integrated circuit chip, said chip having located thereon an oscillator coupled to a counter and to control logic means for controlling the operation of said oscillator, comprising the steps of:
setting the value of said counter to a predetermined value;
placing said oscillator in an operational mode such that the output of said oscillator continuously changes between a low value and a high value;
utilizing said counter to count the oscillations of said oscillator;
waiting a predetermined amount of time;
placing said oscillator in a standby mode such that said output of said oscillator is held at a fixed value;
reading the output of said counter after said period of time, the output of said counter being a function of the speed of said integrated circuit.

17. The method as defined by claim 16, further including the step of generating and sending a READ signal from an external processor to said control logic means to read the value of said counter.

* * * * *